United States Patent
Kwon et al.

(10) Patent No.: US 7,807,339 B2
(45) Date of Patent: Oct. 5, 2010

(54) PRINTING PLATE AND PATTERNING METHOD USING THE SAME

(75) Inventors: Oh Nam Kwon, Gyeonggi-do (KR); Heung Lyul Cho, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 917 days.

(21) Appl. No.: 11/314,313

(22) Filed: Dec. 22, 2005

(65) Prior Publication Data

US 2006/0292487 A1 Dec. 28, 2006

(30) Foreign Application Priority Data

Jun. 24, 2005 (KR) .................. 10-2005-0055204

(51) Int. Cl.
*G03F 1/00* (2006.01)
*G03F 7/00* (2006.01)

(52) U.S. Cl. .................. 430/322; 430/302; 430/325; 430/323; 430/324

(58) Field of Classification Search .......... 430/270.1, 430/275.1, 286.1, 299, 302, 322, 323, 324, 430/5

See application file for complete search history.

(56) References Cited

U.S. PATENT DOCUMENTS

| | | | |
|---|---|---|---|
| 5,419,989 A * | 5/1995 | Takimoto et al. .......... 430/5 |
| 6,653,232 B2 * | 11/2003 | Uda et al. .......... 438/669 |
| 7,247,659 B2 * | 7/2007 | Kura et al. .......... 522/12 |
| 2001/0026896 A1 * | 10/2001 | Nishikawa et al. .......... 430/7 |
| 2001/0033998 A1 * | 10/2001 | Fujio .......... 430/322 |
| 2003/0027417 A1 * | 2/2003 | Uda et al. .......... 438/618 |
| 2003/0080471 A1 * | 5/2003 | Chou .......... 264/338 |
| 2004/0081921 A1 * | 4/2004 | Yamashita .......... 430/322 |
| 2004/0178170 A1 * | 9/2004 | Morimoto .......... 216/12 |
| 2005/0158987 A1 * | 7/2005 | Choi .......... 438/636 |

* cited by examiner

*Primary Examiner*—Cynthia H Kelly
*Assistant Examiner*—Chanceity N Robinson
(74) *Attorney, Agent, or Firm*—Morgan, Lewis & Bockius LLP

(57) ABSTRACT

A patterning method includes depositing a pattern target layer on a surface of a substrate, providing a printing plate with concaves in a first side of a transparent substrate and an opaque layer on the first side except in the concaves of the first sides, filling resins into the concaves of the printing plate, positioning the substrate of the printing plate to correspond to an upper portion of the pattern target layer, and transferring resins of the printing plate onto the pattern target layer by exposing resins to a curing light to harden resins.

13 Claims, 7 Drawing Sheets

PRINTING PLATE AND PATTERNING METHOD USING THE SAME

This application claims the benefit of Korean Patent Application No. 10-2005-0055204, filed on Jun. 24, 2005, which is hereby incorporated by reference in its entirety.

BACKGROUND OF THE INVENTION

1. Field of the Invention

The present invention relates to printing, and more particularly, to a printing plate and a patterning method using the same. Although the present invention is suitable for a wide scope of applications, it is particularly suitable for removing residuals generated when resins are printed in fabricating a liquid crystal display (LCD) device.

2. Discussion of the Related Art

Demands for flat display devices have increased as the information society has developed. Accordingly, many efforts have been made in researching and developing various types of flat display devices, such as liquid crystal display (LCD), plasma display panel (PDP), electroluminescent display (ELD), and vacuum fluorescent display (VFD). Some of these flat display devices have already been used as displays in various kinds of equipment.

Among the various types of flat display devices, liquid crystal display (LCD) devices have been most widely used due to their advantageous characteristics of thin profile, light weight, and low power consumption. Typically, LCD devices have been used as substitutes for the Cathode Ray Tube (CRT). In addition to mobile type LCD devices, such as a display for a notebook computer, LCD devices have been developed for use as computer monitors and as televisions. The key to developing LCD devices such that they continue to be used as the most attractive flat display device is dependent on whether LCD devices can implement a higher quality picture, such as a higher resolution and/or a higher luminance large-sized screen, while still maintaining light weight, a thin profile, and low power consumption.

FIG. 1 is an exploded perspective view illustrating a related art LCD device. Hereinafter, a related art LCD device will be described with reference to FIG. 1. As shown in FIG. 1, the related art LCD device 10 includes first and second substrates 1 and 2 bonded to each other with a cell gap between them, and a liquid crystal layer 3 positioned within the cell gap between the first and second substrates 1 and 2.

The first substrate 1 includes a plurality of gate lines 4 arranged along a first direction at fixed intervals and a plurality of data lines 5 arranged along a second direction perpendicular to the first direction at fixed intervals. A plurality of pixel regions P are defined by the gate and data lines 4 and 5. A plurality of electrodes 6 are arranged within the pixel regions P. A plurality of thin film transistors T are formed adjacent to where the gate lines cross the data lines. The thin film transistor applies data signals of the data lines 5 to the pixel electrodes 6 in accordance with signals supplied to the gate lines 4.

The second substrate 2 includes a black matrix layer 7 that prevents light from exiting the second substrate except at the pixel regions P, R/G/B color filter layers 8 for displaying various colors are formed to correspond to the pixel regions, and a common electrode 9 opposite to the pixel electrodes 6 on the first substrate 1.

In the aforementioned LCD device, the liquid crystal layer 3 is positioned between the first and second substrates 1 and 2 such that the liquid crystal molecules of the liquid crystal layer 3 are driven by electric fields generated between the pixel electrode 6 and the common electrode 9. In other words, an alignment direction of the liquid crystal molecules of the liquid crystal layer 3 is controlled by the induced electric fields between the pixel electrode 6 and the common electrode 9. Accordingly, light passing through the liquid crystal layer 3 may be controlled by the alignment direction of the liquid crystal molecules, thereby displaying an image.

FIGS. 2A to 2D are cross-sectional views illustrating a related art method for patterning metal using a printing method. Hereinafter, the related art method for patterning lines, such as the gate and data lines in the related art LCD device, will be described with reference to FIGS. 2A to 2D. As shown in FIG. 2A, a metal layer 21 is deposited across the entire surface of the substrate 20. As shown in FIG. 2B, a transparent printing plate 30 having concaves 31 on a predetermined surface of a base substrate 35 is provided. The concaves 31 are filled with resins 32.

As shown in FIG. 2C, the transparent printing plate 30 is positioned to correspond to the substrate 20 so that the resins 32 of the transparent printing plate 30 are transferred onto the metal layer 21 on the substrate 20. Thus, as shown in FIG. 2D, the resins 32 from the concaves 31 remain on the metal layer 21. However, some residual resins 32a may also be printed between the remaining resins 32 on the metal layer 21. Such residual resins 32a may cause problems.

FIG. 3A and FIG. 3B are cross-sectional views illustrating residual resins generated by the related art method for patterning metal using a printing method.

As shown in FIG. 3A, the metal layer 21 is patterned by an etching process using the resins 32 as masks. When residual resins remain, a proper metal pattern 21a corresponding to a width of the remaining resin 32 can not be formed. Because the residual resins 32a are recognized as masks during the etching process, a metal residual 21b remains below the residual resin 32a after etching. Further, as shown in FIG. 3B, if the resins 32 are connected with one another by the residual resins 32a, the metal layer below adjacent resins 32 and the residual resin 32a between the adjacent resins 32 is etched to form a metal pattern 21c below the adjacent resins 32 and the residual resin 32a between the adjacent resins 32. The metal pattern 21c is formed in a single body without isolation. In this case, one metal pattern is formed incorrectly connecting one line with another line causing line shorting.

The related art patterning method also has the following problems. The residual resins can cause poor color characteristics and a step difference when the color resins are patterned for the color filter layers. Such a step difference causes a non-uniform cell gap, thereby generating a spot on the display panel.

SUMMARY OF THE INVENTION

Accordingly, the present invention is directed to a printing plate and a patterning method using the same that substantially obviate one or more problems due to limitations and disadvantages of the related art.

An object of the present invention is to provide a printing plate and a patterning method using the same in which residuals generated when resins are printed are effectively removed.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a printing plate according to the present invention includes a transparent base substrate provided with concaves on a surface of the transparent base substrate, and an opaque layer formed on the surface except in the concaves of the surface.

In another aspect of the present invention, a patterning method includes depositing a pattern target layer on a surface of a substrate, providing a printing plate with concaves in a first side of a transparent substrate and an opaque layer on the first side except in the concaves of the first sides, filling resins into the concaves of the printing plate, positioning the substrate of the printing plate to correspond to an upper portion of the pattern target layer, and transferring resins of the printing plate onto the pattern target layer by exposing resins to a curing light to harden resins.

In other aspect of the present invention, a patterning method includes depositing a pattern target layer on a surface of a substrate, providing a printing plate with concaves in a first side of a transparent substrate and an opaque layer on the first side except in the concaves of the first side, filling photoresist resins into the concaves of the printing plate, positioning the substrate of the printing plate to correspond to an upper portion of the pattern target layer, transferring photoresist resins of the printing plate onto the pattern target layer by exposing photoresist resins to a curing light to harden photoresist resins, removing non-hardened photoresist resins using a solution that dissolves the non-hardened photoresist resins while not affecting the hardened photoresist resins, etching the pattern target layer using the hardened photoresist resins as masks, and removing the hardened resins.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
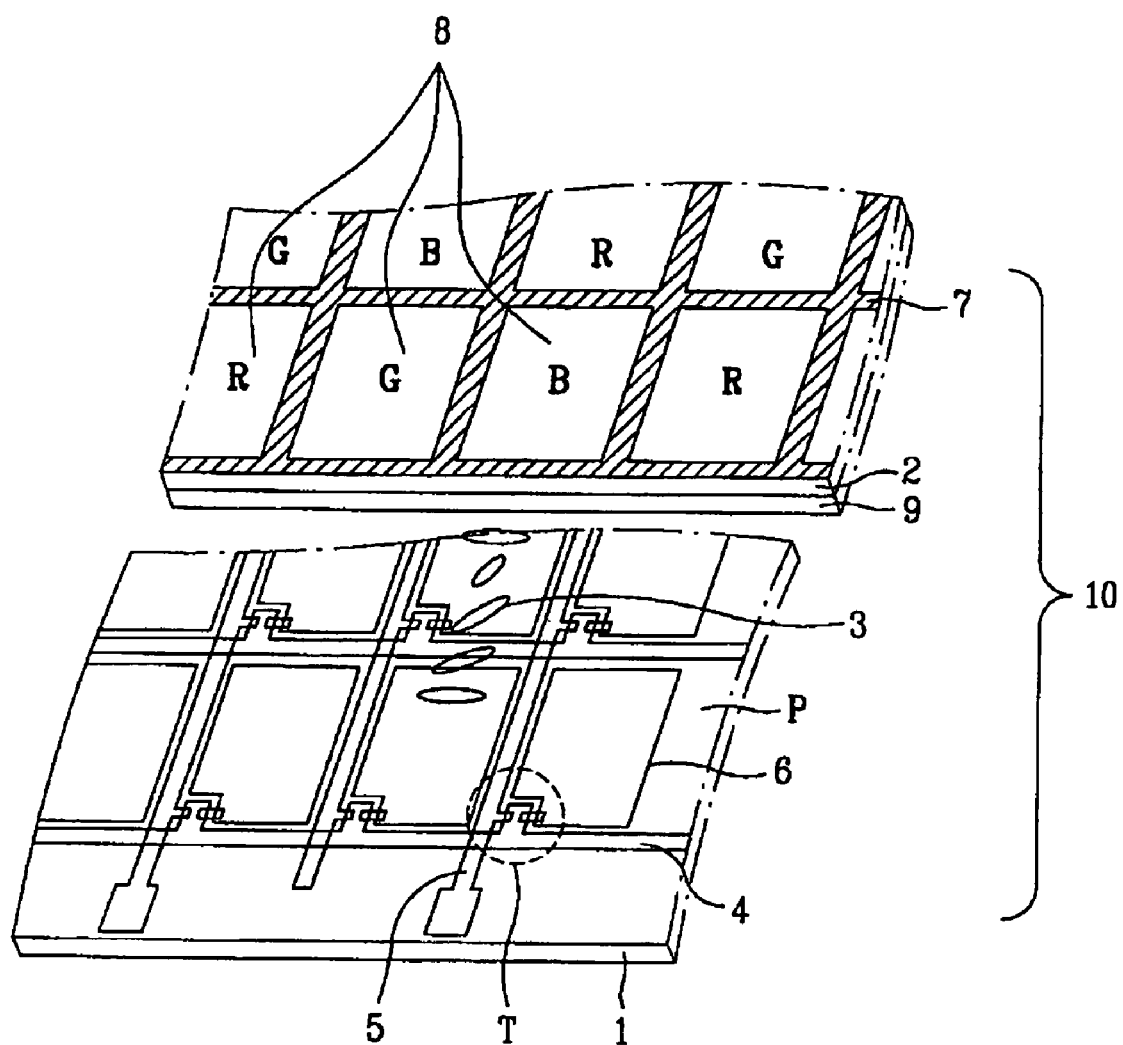
FIG. 1 is an exploded perspective view illustrating a related art LCD device.
Figure 2A:
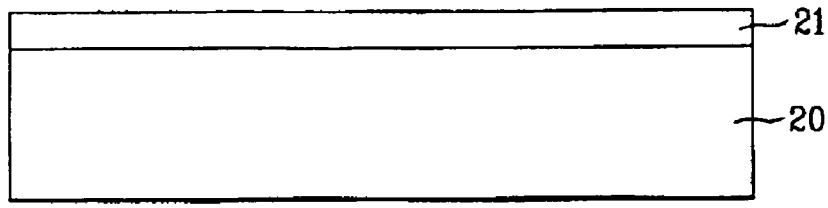
FIG. 2A to FIG. 2D are cross-sectional views illustrating a related art method for patterning metal using a printing method.
Figure 2B:
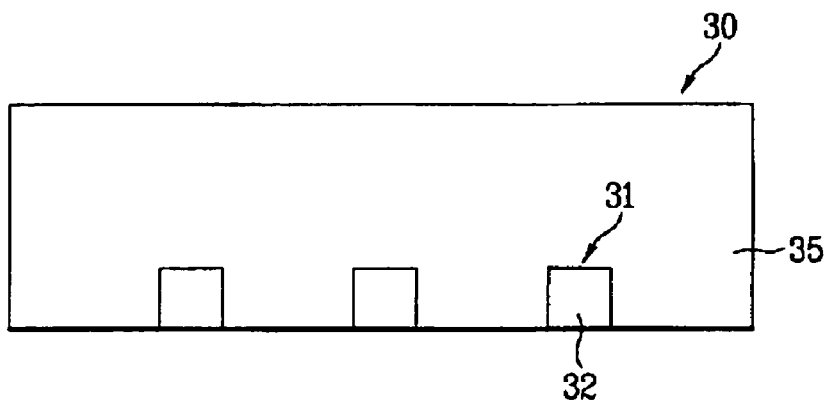
Figure 2C:
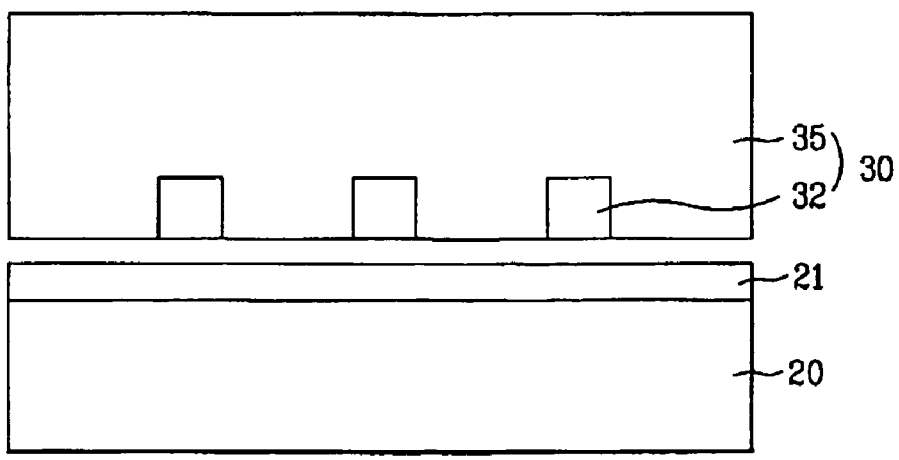
Figure 2D:
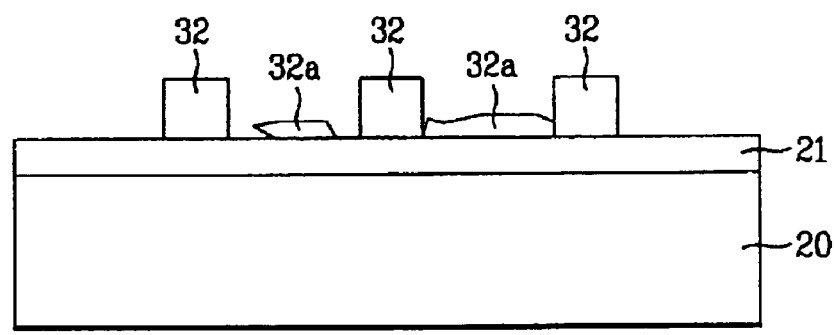
Figure 3A:
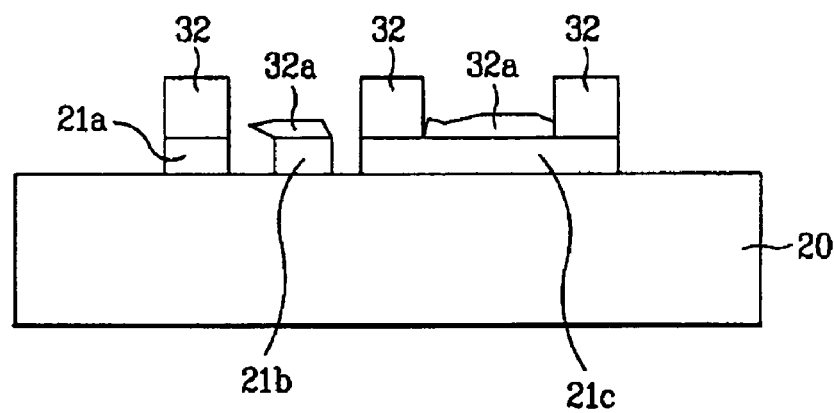
FIG. 3A and FIG. 3B are cross-sectional views illustrating residual resins generated in the related art method for patterning metal using a printing method.
Figure 3B:
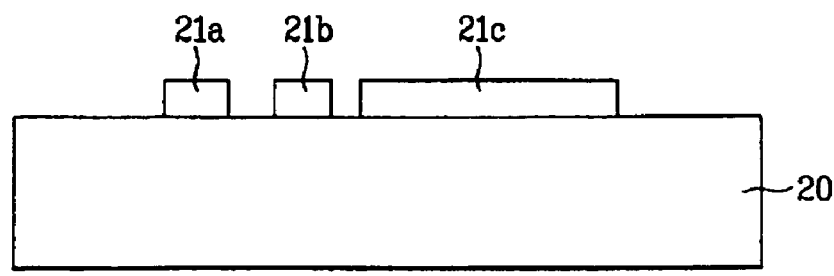
Figure 4A:
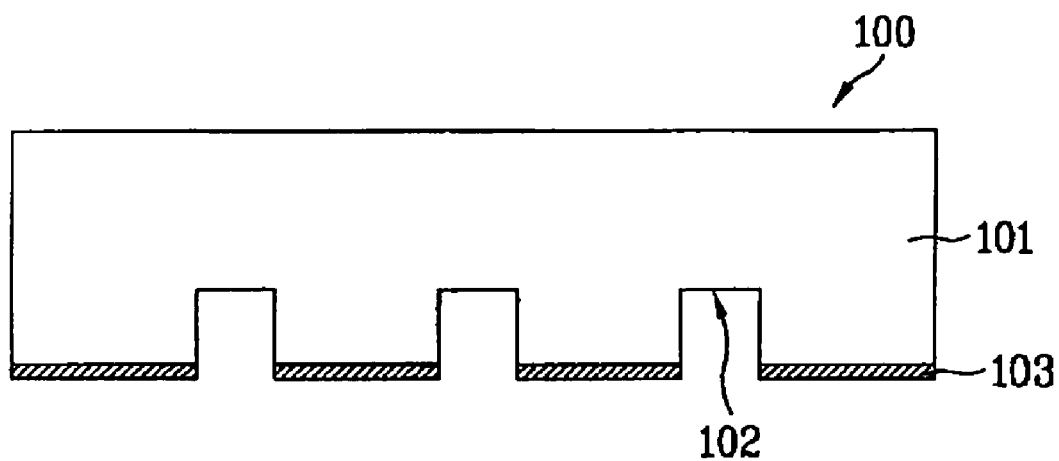
FIG. 4A and FIG. 4B are cross-sectional views illustrating a printing plate used for a patterning method according to an embodiment of the present invention.
Figure 4B:

FIG. 4A and FIG. 4B are cross-sectional views illustrating a printing plate used for a patterning method according to an embodiment of the present invention. As shown in FIG. 4A, a printing plate 100 used for the patterning method according to an embodiment of the present invention is provided with concaves 102 on a surface of a transparent base substrate 101. An opaque material 103 is deposited on the surface of the transparent base substrate 101, in which the concaves are formed.

When the printing plate 100 is used for a patterning process, as shown in FIG. 4B, the concaves 102 are filled with resins 104. The resins 104 can be negative photoresist resins. The resins 104 are characterized in that complex polymers constituting light-receiving portions of the resins 104 are cross-linked with one another to enhance their linkage and remain after a developing process while portions that did not receive light do not have linkage amongst the complex polymers and are later dissolved and removed by a developing solution.

The base substrate 100 can be made of a transparent manufactured material that can be molded using a press, or a transparent substrate, such as glass, that has been etched. Further, the substrate 100 can have two-layers, such as a transparent layer having the concaves formed on a transparent glass or manufactured material. The opaque material 103 can be metal or a resin, such as a black matrix resin.

Figure 5A:
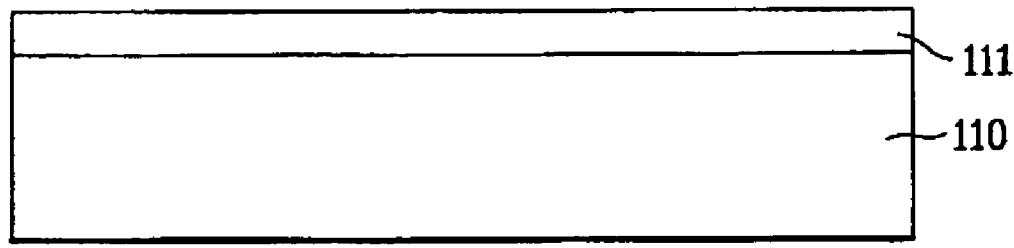
FIGS. 5A to 5F are cross-sectional views illustrating a patterning method according to an embodiment of the present invention.

FIG. 5A to FIG. 5F are cross-sectional views illustrating a patterning method according to an embodiment of the present invention. As shown in FIG. 5A, a metal layer 111 is deposited on the entire surface of a substrate 110.

Figure 5B:
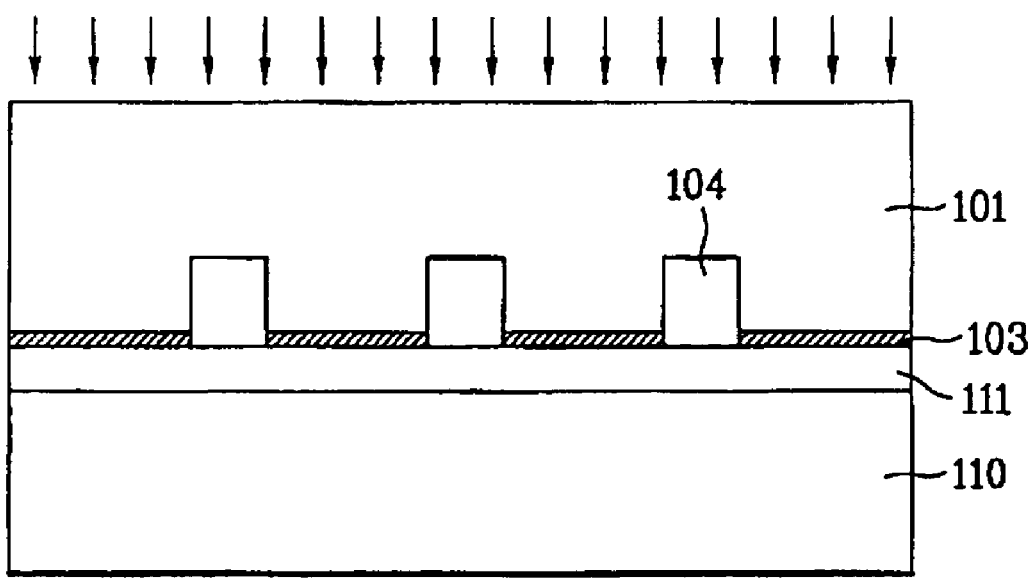

Subsequently, the concaves 102 of the printing plate 100 filled with the negative photoresist resins, as shown in FIG. 4B, is positioned so that a portion constituting the concaves 102 of the printing plate 100 corresponds to the metal layer 111 on the substrate 110, as shown in FIG. 5B. An upper portion of the printing plate 101 is then exposed to a curing light such that the resins in the concaves 102 of the printing plate 100 are exposed to the curing light and are transferred onto the metal 111. In this instance, since the resins 104 are negative photoresist resins, they develop in response to exposure to the curing light. Linkage of the complex polymers in the resins 104 during the exposing process occurs such that the exposed resins are incompletely hardened.

Figure 5C:
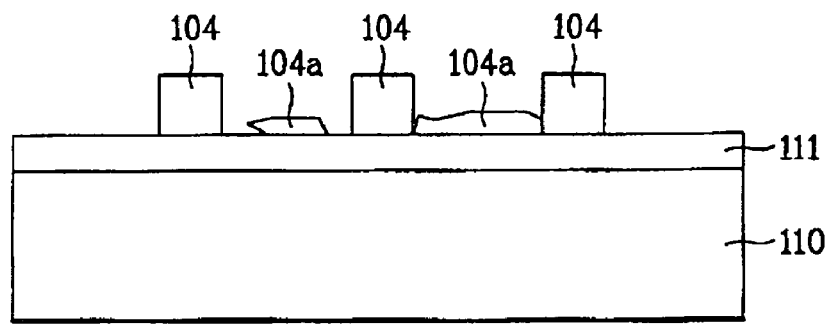

As shown in FIG. 5C, residual resins 104a may remain on the metal layer 111 that were not suppose to be printed during the printing process. These residual resins 104a were not exposed to the curing light during the printing process because they were shielded by the opaque material 103. Accordingly, the residual resins 104a were not hardened during the printing process.

Figure 5D:
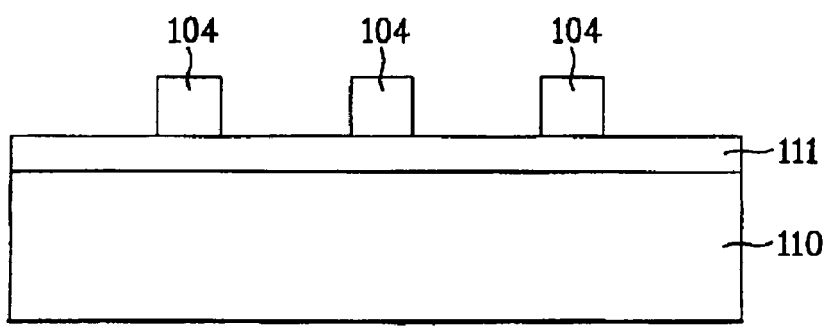
Figure 5E:
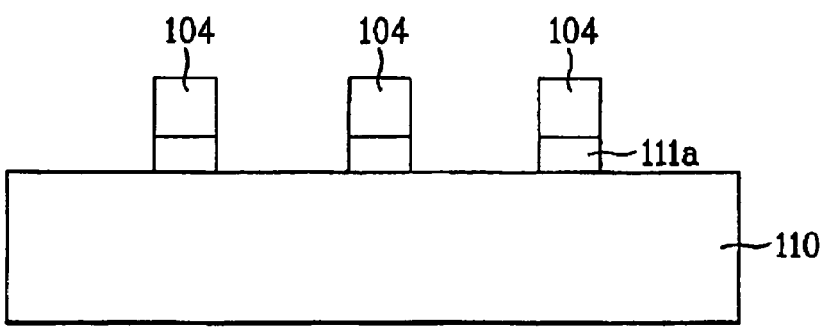
Figure 5F:
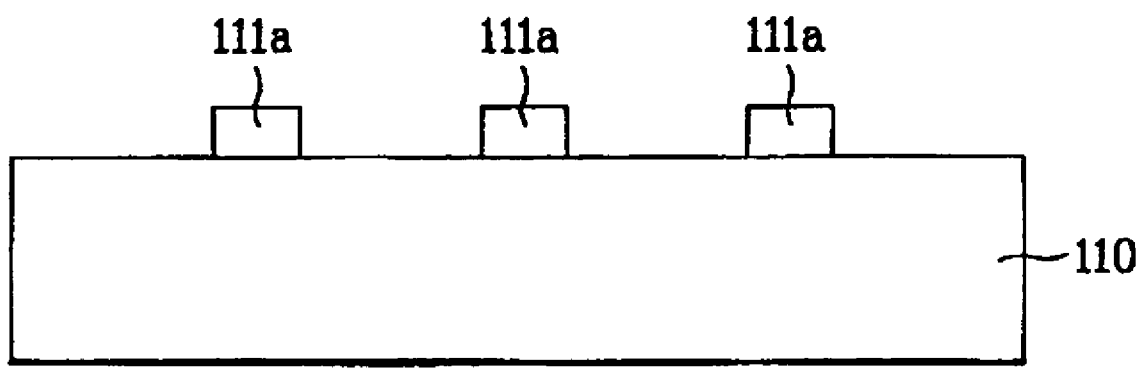

As shown in FIG. 5D, the non-hardened residual resins 104a can be dissolved and removed by a developing step prior to etching the metal layer 111. Such a developing step includes using a solvent that dissolves the residual resins 104a while not affecting the incompletely hardened resins 104. Such a developing step results in a resin pattern without any undesired resins. As shown in FIG. 5E, the metal 111 is etched using the resins 104 as masks to form metal patterns 111a. As shown in FIG. 5F, the resins 104 are removed by a stripper that dissolves the incompletely hardened resins 104. After the developing process, it is possible to improve the hardening degree of the negative photoresist resins 104 remaining on the substrate through a subsequent curing process, such as a heating a step or additional curing light exposure.

In the patterning method according to an embodiment of the present invention, negative photoresist resins are used and hardened by a curing light exposure process during printing. Therefore, any residual resins can be easily removed through a development process that removes all non-hardened resins. Thus, it is possible to prevent line shorts caused by a residual resin and to prevent undesired metal from remaining in a region of a device. As a result, yield of the metal etching process can be improved.

In the patterning method according to an embodiment of the present invention, other types of layers can also be patterned. For example, a gate insulating layer, an insulating layer such as a passivation layer, a semiconductor layer, or a color filter layer can be pattern target layers. An embodiment of the present invention can also be used to form a contact hole in a layer.

A color filter layer may be formed by exposing and developing processes of negative resins of color filters without a separate etching process. In this case, since negative resins of color filters filled into the printing plate 100 remain on the substrate to serve as a pattern, no separate color filter layer has to be formed on the substrate 110 and then etched. The negative resins of color filters in the printing plate 100 are transferred onto the substrate after the exposing and developing processes and remain in a state in which they are somewhat hardened.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A patterning method comprising the following sequence:
   a. depositing a pattern target layer on a surface of a substrate;
   b. providing a printing plate with concaves in a first side of a transparent substrate and an opaque layer on the first side except in the concaves of the first sides;
   c. filling resins into the concaves of the printing plate;
   d. positioning the substrate of the printing plate to correspond to an upper portion of the pattern target layer; and
   e. transferring the resins of the printing plate onto the pattern target layer by exposing a rear surface of the printing plate to harden the resins.

2. The patterning method according to claim 1, further comprising:
   removing non-hardened resins with a developing process.

3. The patterning method according to claim 2, wherein the developing process uses developing solution to dissolve the non-hardened resins only.

4. The patterning method according to claim 2, further comprising:
   etching the pattern target layer using the hardened resins as masks; and
   removing the hardened resins.

5. The patterning method according to claim 2, further comprising:
   curing the hardened resins after the developing process to increase hardness of the hardened resins.

6. The patterning method according to claim 1, wherein the resins are negative photoresist resins.

7. The patterning method according to claim 1, wherein the resins are color filter resins.

8. The patterning method according to claim 1, wherein the resins are negative color filter resins.

9. The patterning method as claimed in claim 1, wherein the pattern target layer is one of metal, semiconductor and insulating layers.

10. A patterning method comprising the following sequence:
    a. depositing a pattern target layer on a surface of a substrate;
    b. providing a printing plate with concaves in a first side of a transparent substrate and an opaque layer on the first side except in the concaves of the first side;
    c. filling photoresist resins into the concaves of the printing plate;
    d. positioning the substrate of the printing plate to correspond to an upper portion of the pattern target layer;
    e. transferring the photoresist resins of the printing plate onto the pattern target layer by exposing a rear surface of the printing plate to harden the photoresist resins;
    f. removing non-hardened photoresist resins using a solution that dissolves the non-hardened photoresist resins while not affecting the hardened photoresist resins;
    g. etching the pattern target layer using the hardened photoresist resins as masks; and
    h. removing the hardened resins.

11. The patterning method according to claim 10, further comprising:
    curing the hardened resins after removing non-hardened photoresist resins to improve hardness of the hardened resins.

12. The patterning method as claimed in claim 10, wherein the pattern target layer is one of metal, semiconductor and insulating layers.

13. The patterning method as claimed in claim 10, wherein the pattern target layer has a contact hole.

* * * * *